United States Patent
Willey et al.

(10) Patent No.: US 12,140,620 B2
(45) Date of Patent: *Nov. 12, 2024

(54) ELECTRICAL CONTACT WEAR MONITORING SYSTEM

(71) Applicant: Caterpillar Inc., Peoria, IL (US)

(72) Inventors: Christopher A. Willey, Oro Valley, AZ (US); Eric J. Ruth, Peoria, IL (US); Zachary R. Carter, Oro Valley, AZ (US); Bradley Scott Bailey, Edwards, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/525,391

(22) Filed: Nov. 30, 2023

(65) Prior Publication Data

US 2024/0103061 A1  Mar. 28, 2024

Related U.S. Application Data

(63) Continuation of application No. 17/667,614, filed on Feb. 9, 2022, now Pat. No. 11,874,314.

(51) Int. Cl.
| | |
|---|---|
| *G01R 31/00* | (2006.01) |
| *B60L 5/18* | (2006.01) |
| *B60L 5/24* | (2006.01) |
| *B60Q 9/00* | (2006.01) |
| *G01B 11/02* | (2006.01) |
| *G01R 31/327* | (2006.01) |

(52) U.S. Cl.
CPC ............ *G01R 31/005* (2013.01); *B60Q 9/00* (2013.01); *G01R 31/3274* (2013.01); *B60L 5/18* (2013.01); *B60L 5/24* (2013.01); *G01B 11/022* (2013.01)

(58) Field of Classification Search
CPC .... G01R 31/005; G01R 31/3274; B60Q 9/00; B60L 5/18; B60L 5/24; G01B 11/022
See application file for complete search history.

(56) References Cited

U.S. PATENT DOCUMENTS

| | | |
|---|---|---|
| 8,071,967 B2 | 12/2011 | Watabe et al. |
| 9,403,526 B2 | 8/2016 | Saito et al. |
| (Continued) | | |

FOREIGN PATENT DOCUMENTS

| | | | |
|---|---|---|---|
| CN | 111169487 A | * | 5/2020 |
| DE | 102015117075 A1 | * | 4/2017 |
| (Continued) | | | |

OTHER PUBLICATIONS

"U.S. Appl. No. 17/667,614, Non Final Office Action mailed Dec. 22, 2022", 16 pgs.

(Continued)

*Primary Examiner* — Daniel R Miller

(57) ABSTRACT

A system for monitoring electrical contacts for an overhead trolley line may include a wear sensor arranged such that an electrical contact on a vehicle or work machine for contacting the overhead trolley line is continually or periodically in its line of sight. The wear sensor may be configured to capture spatial data defining the surface profile of the electrical contact. The system may also include a data processing module configured to receive the spatial data and identify a defect in the electrical contact based on the spatial data.

17 Claims, 7 Drawing Sheets

(56) References Cited

U.S. PATENT DOCUMENTS

| | | |
|---|---|---|
| 10,102,618 B2 | 10/2018 | Bahlmann et al. |
| 10,836,430 B2 | 11/2020 | Buehs et al. |
| 2007/0272506 A1 | 11/2007 | Herrmann et al. |
| 2010/0322465 A1 | 12/2010 | Wesche et al. |
| 2012/0253695 A1 | 10/2012 | Schrag et al. |
| 2014/0041951 A1 | 2/2014 | Tojima et al. |
| 2016/0139206 A1 | 5/2016 | Carson et al. |
| 2018/0319086 A1 | 11/2018 | Klammer et al. |

FOREIGN PATENT DOCUMENTS

| | | |
|---|---|---|
| JP | 2005071727 | 3/2005 |
| JP | 2015199368 | 11/2015 |
| WO | 2010086045 | 5/2011 |
| WO | 2014115902 | 7/2014 |

OTHER PUBLICATIONS

"Technical Specification", https: www.pantoinspect.com TechnicalSpecifications, (Aug. 1, 2021), 2 pgs.

"U.S. Appl. No. 17/667,614, Response filed Mar. 20, 2023 to Non Final Office Action mailed Dec. 22, 2022", 8 pgs.

"U.S. Appl. No. 17/667,614, Final Office Action mailed Jun. 23, 2023", 18 pgs.

"U.S. Appl. No. 17/667,614, Response filed Aug. 21, 2023 to Final Office Action mailed Jun. 23, 2023", 8 pgs.

"U.S. Appl. No. 17/667,614, Notice of Allowance mailed Sep. 1, 2023", 10 pgs.

Doyle, Shane, "Pantograph condition monitoring system for automated maintenance inspections and prevention of overhead wiring tear downs", (2016), 10 pgs.

Judek, Slawomir, "Analysis of Measurement Errors in Rail Vehicles' Pantograph Inspection System", vol. 22, No. 3, (2016), 4 pgs.

Strano, Salvatore, "Railway pantograph contact strip monitoring through image processing techniques", (2021), 5 pgs.

"International Application Serial No. PC/US2023/061054, International Search Report and Written Opinion mailed May 19, 2023", 9 pgs.

U.S. Appl. No. 17/667,614, filed Feb. 9, 2022, Electrical Contact Wear Monitoring System.

* cited by examiner

ELECTRICAL CONTACT WEAR MONITORING SYSTEM

CLAIM OF PRIORITY application is a continuation of U.S. patent application Ser. No. 17/667,614, filed on Feb. 9, 2022, the benefit of priority of which is claimed hereby, and which is incorporated by reference herein in its entirety.

TECHNICAL FIELD

The present application relates generally to vehicles such as trains, work machines, trolleys, or buses that are powered by overhead trolley lines. More particularly, the present application relates to monitoring wear of contacts between work machines and overhead trolley lines. Still more particularly, the present application relates to monitoring wear of the contacts between mining machines and the overhead trolley line using a light detection and ranging system.

BACKGROUND

Vehicles powered by overhead trolley lines often have a pantograph system on a top of the vehicle that presses electrical contacts upward against the trolley lines. The electrical contacts may be relatively wide elements that extend in a lateral direction relative to the direction of vehicle motion and likewise lateral to the trolley lines. This arrangement may allow for variance in the side-to-side positioning of the vehicle and resulting effects on alignment of the vehicle with the trolley lines.

Work machines may rely on overhead trolley lines to transport loads across long haul roads. That is, for example, some mining operations may include trolley lines that extend over a relatively high percentage of the haul distance. For example, trolley lines in quarry operations may be provided over 20%-75% of the haul distance, for example. Where portions of the haul distance are not provided with trolley lines, the work machines may rely on gas or diesel power, for example.

Inspection of the contacts between the vehicles and the trolley lines may be performed to identify defects such as cracked or broken contacts and/or to identify high wear areas on the contacts. Since trolley lines are generally placed high above the ground for safety purposes and since work machines are often very large vehicles causing the lines to be placed even higher, the contacts are also quite high above the ground. As such, visual inspection of the contacts can be difficult. Moreover, since the contacts generally face upward, visual inspection from below may not be fully effective at identifying defects or high wear areas. In some cases, scaffolding may be set up to allow for visually inspecting the contacts.

U.S. Pat. No. 10,836,430 relates to a motor vehicle with a control device, a first sensor, and a global positioning system. The first sensor determines the position of the overhead line relative to the motor vehicle and provides the control unit with the relative position. The global positioning device determines a global position of the motor vehicle and provides the control unit with it. The control unit, on the basis of the established relative position, the established global position, and the information about the arrangement of the overhead line, calculates a position of the motor vehicle. US Patent Publication 2020/0063402 relates to a wear member monitoring system for a ground engaging tool.

SUMMARY

In one or more examples, a system for monitoring electrical contacts for an overhead trolley line may include a wear sensor arranged such that an electrical contact on a vehicle or work machine for contacting the overhead trolley line is continually or periodically in its line of sight. The wear sensor may be configured to capture spatial data defining the surface profile of the electrical contact. The system may also include a data processing module configured to receive the spatial data and identify a defect in the electrical contact based on the spatial data.

In one or more examples, a method of assessing wear of an electrical contact for an overhead trolley line may include receiving spatial data from a wear sensor defining the surface profile of an electrical contact on a vehicle or work machine. The method may also include identifying a defect in the electrical contact based on the spatial data.

DETAILED DESCRIPTION

Figure 1:
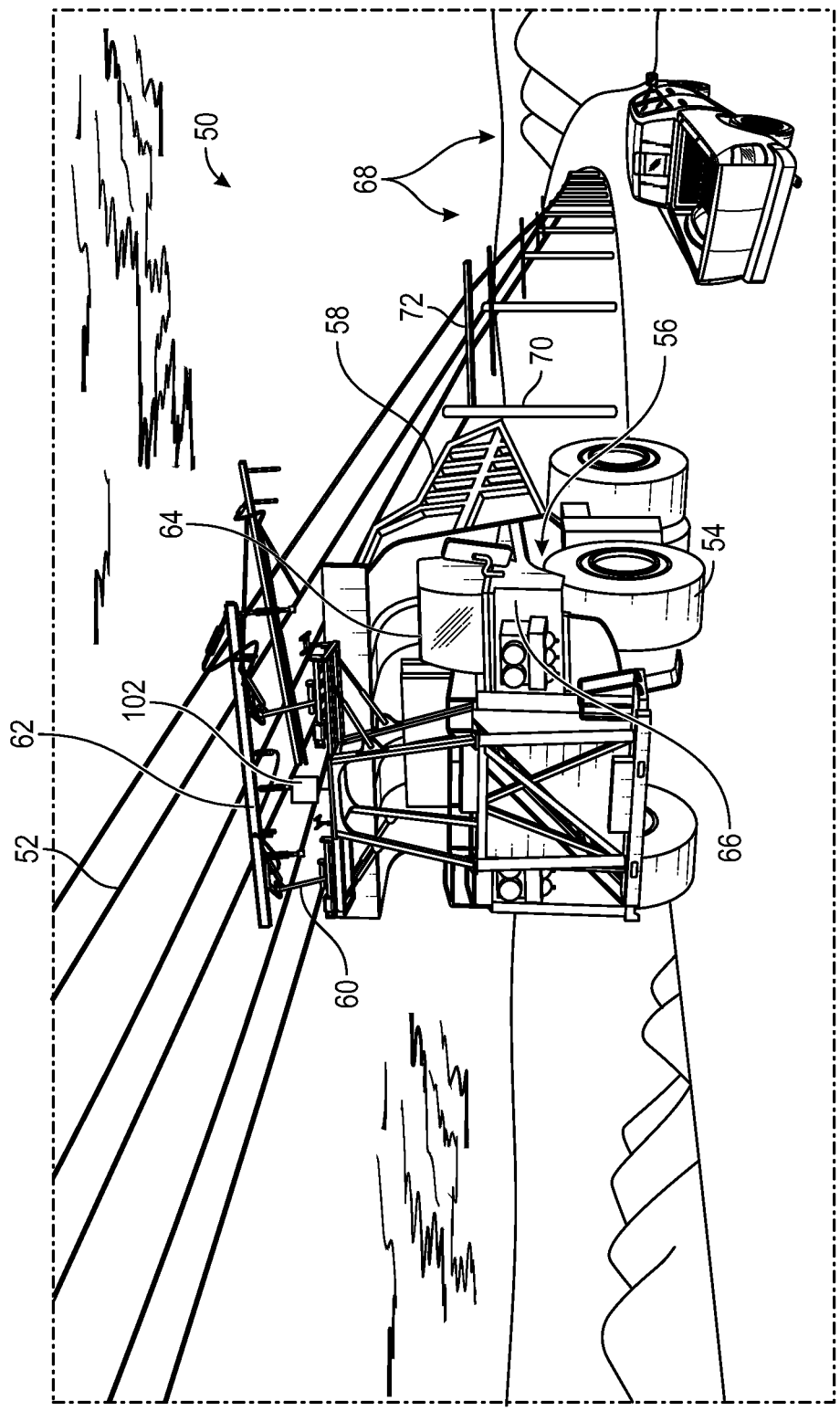
FIG. 1 is a perspective view of a work machine on a haul road provided with an overhead trolley line and showing one or more wear monitors, according to one or more examples.
Figure 2:
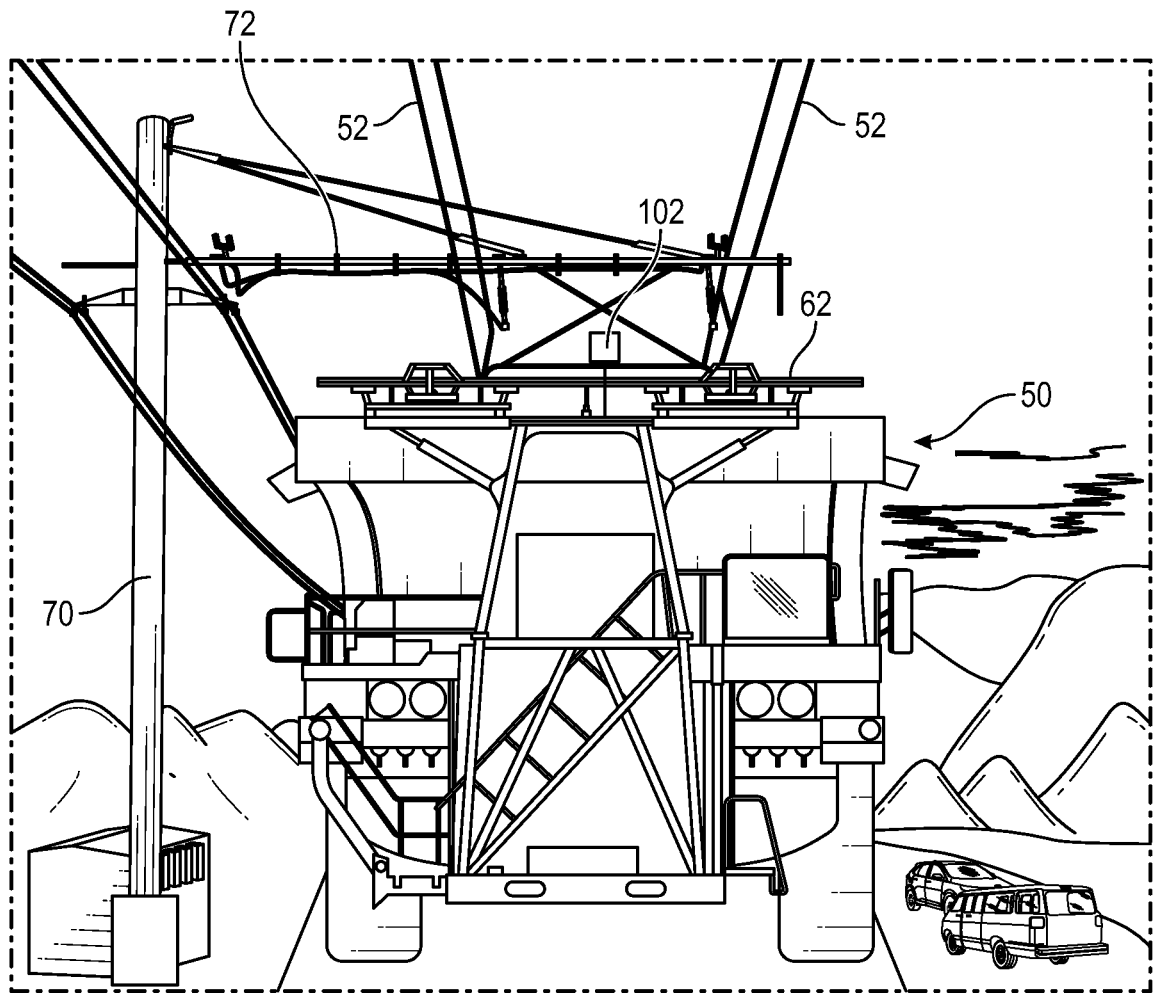
FIG. 2 is front view thereof.

FIG. 1 is a perspective view of a work machine 50 on a haul road provided with an overhead trolley line 52 and showing one or more wear sensors 102, according to one or more examples. FIG. 2 is a front view thereof. As shown, the work machine 50 may include a haul truck such as a haul truck used for quarry mining operations. The haul truck may be configured to be loaded with material and to carry the material from a mined location to a processing location along the haul road. In particular, the haul truck may be configured for selective operation by a combustion engine (e.g., gas or diesel) or an electric motor. The haul truck may include a ground engaging element such as a track or wheel system 54 and a frame 56 supported off of the ground engaging element by a suspension. The frame may support an engine, an electric motor, and a drive train extending from the engine/motor to the ground engaging element 54. A truck bed 58 may be provided for holding and carrying cargo and a pantograph 60 or other biasing mechanism may be provided for selectively placing electrical contacts 62 in electrical communication with overhead trolley lines 52. A cab or other operator station 64 may be provided and/or a remote-control receiving station may be provided. In addition, a control system or device 66 such as an electronic control module or other computing device may be provided for receiving user commands and controlling the machine 50 accordingly, or automated operations may be performed by the control system 66. The haul truck may also include a wear sensor 102 where the system includes a sensor on the work machine 50. Additionally, or alternatively, a wear sensor 102 may be provided at an off-machine location as shown and discussed in more detail below.

With continued reference to FIG. 1, an electrical power system may include a series of supports or towers 68 spaced along the haul road and configured to support overhead trolley lines 52 above the haul road. To that end, the supports 68 may include upright columns or poles 70 and a transverse beam 72 extending laterally from upright column or pole 70 across and above the haul road. In one or more examples, the transverse beam 72 may be a cantilevered beam, as shown, or a braced beam or another column or pole may be provided on an opposite side of the haul road to support an opposite end of the transverse beam 72. The overhead trolley lines 52 may be arranged generally above the haul road and suspended from the transverse beams 72 of the series of supports or towers 68. As shown, the work machines 50 may travel along the haul road generally below the trolley lines 52. The pantograph or other biasing mechanism 60 may be provided on the work machine 50 to press electrical contacts 62 upward against the trolley lines 52 as the work machine 50 travels along the haul road such that electrical power may be transmitted from the overhead trolley lines 52, through the contacts 62 and to the electrical systems of the haul truck such as, for example, the electric motor, gauges, and controls.

Figure 3:
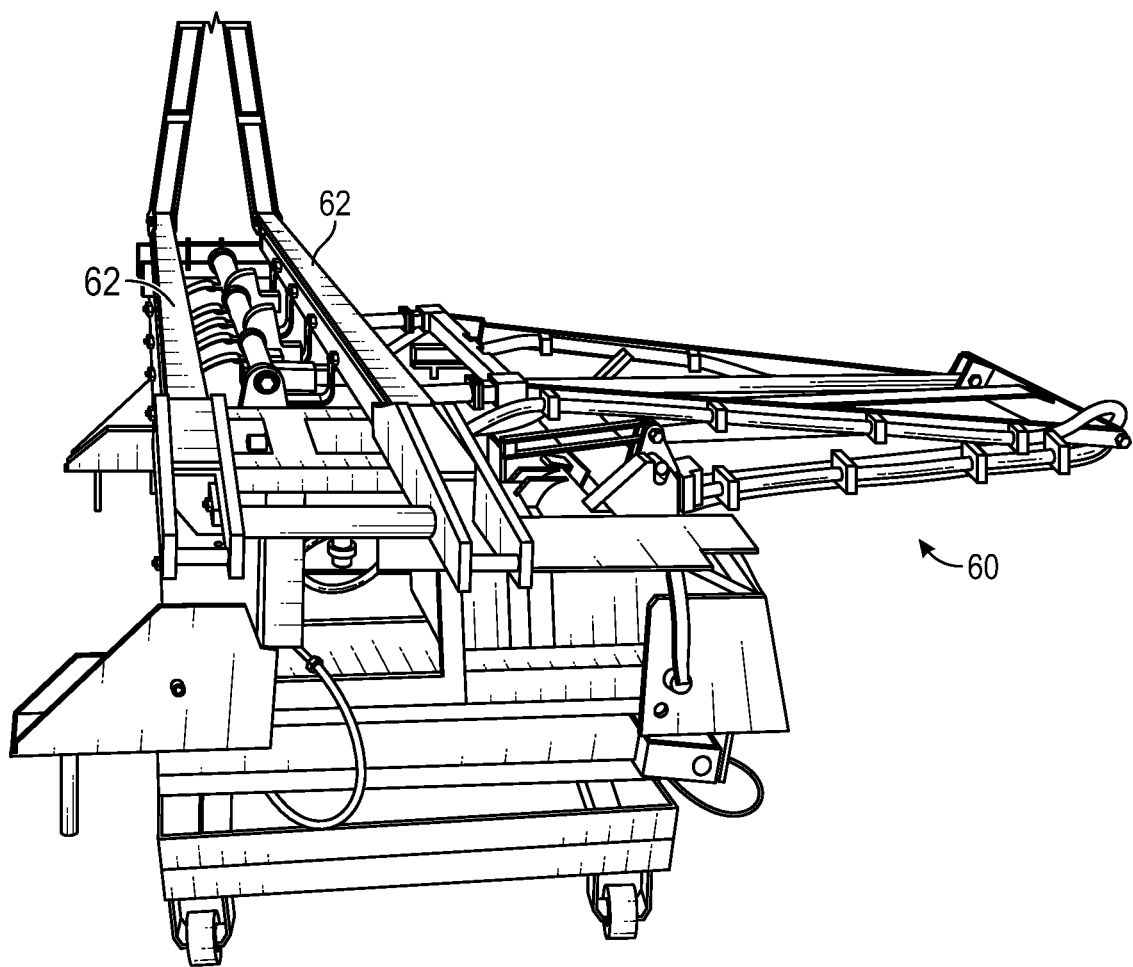
FIG. 3 is a perspective view of a pantograph having contacts for electrical operation of a work machine.

One example pantograph 60 is shown in FIG. 3. The pantograph 60 of haul trucks may create a relatively high upward force of the contacts 62 on the overhead trolley lines 52. That is, when compared to light rail systems or other systems with relatively predictable and even vehicle pathways, the pantograph 60 of a haul truck may include a much larger upward force. This may help with uneven roadway conditions, the flexibility of or variability of the suspension systems or tires, and/or other factors that may otherwise cause the electrical contacts to become disconnected from the overhead trolley lines 52. This upward force from the pantograph 60 may generate a relatively large normal force between the overhead trolley lines 52 and the electrical contacts 62, thus, increasing the friction on the electrical contacts 62 and the resulting wear of the contacts 62. Moreover, the general nature of haul trucks and their working environment can subject the electrical contacts 62 to damage from falling debris, debris from truck loading, or other impact-based damage.

Figure 4:
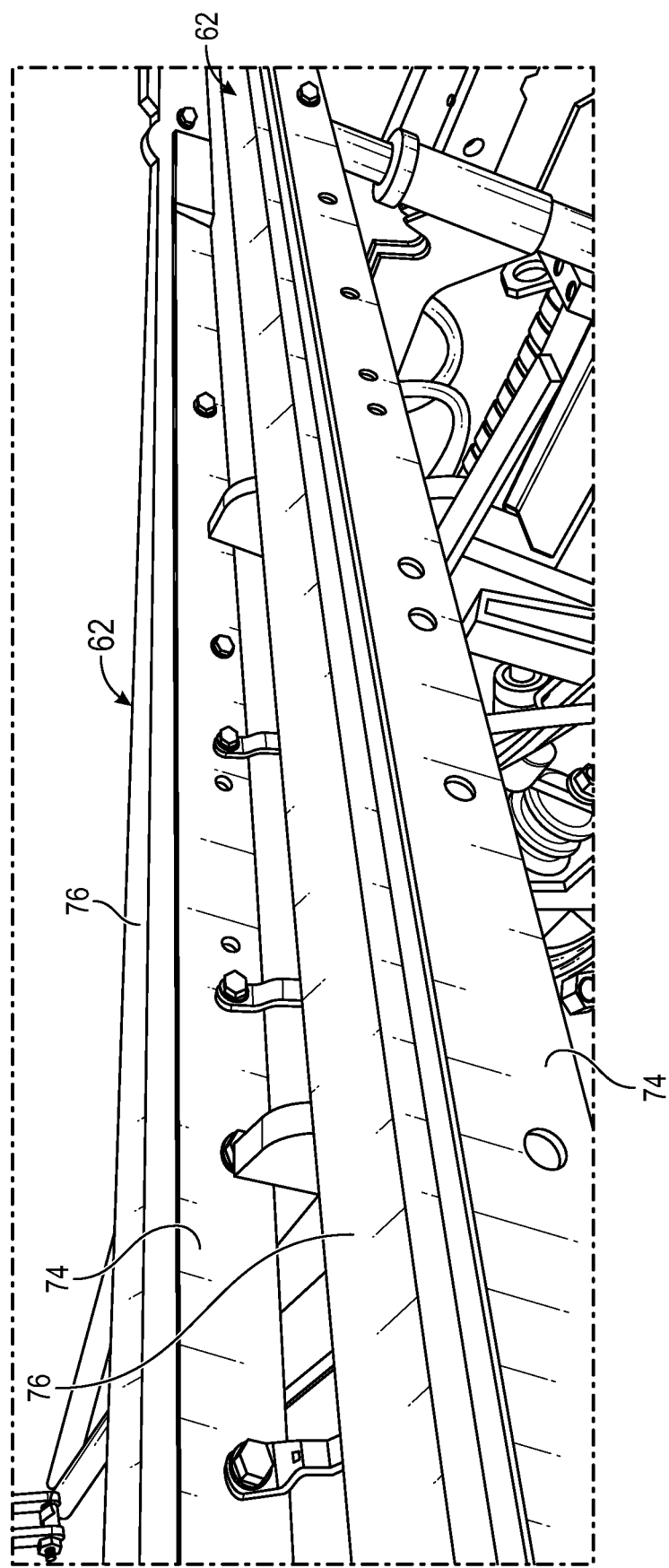
FIG. 4 is a perspective upward looking view of a pair of contacts and showing the difficulties associated with visual inspection from below.

As shown in FIG. 4, the electrical contacts 62 may include metal frames or bars 74 supported by the pantograph 60. The metal frames or bars 74 may include a contact material 76 such as a carbon fiber plate or brush adapted to engage the overhead trolley lines 52. In some examples, the wear discussed above can create grooves or slots in the carbon plate or brush as shown in FIG. 4. If the groove or slot extends fully through the carbon plate or brush, arcing can occur between the overhead trolley lines 52 and the metal frame 74, which can create fire hazard. In other examples, larger portions or segments of the carbon fiber or plate may break off leaving a large area of the metal frame or bar 74 exposed.

Figure 5:
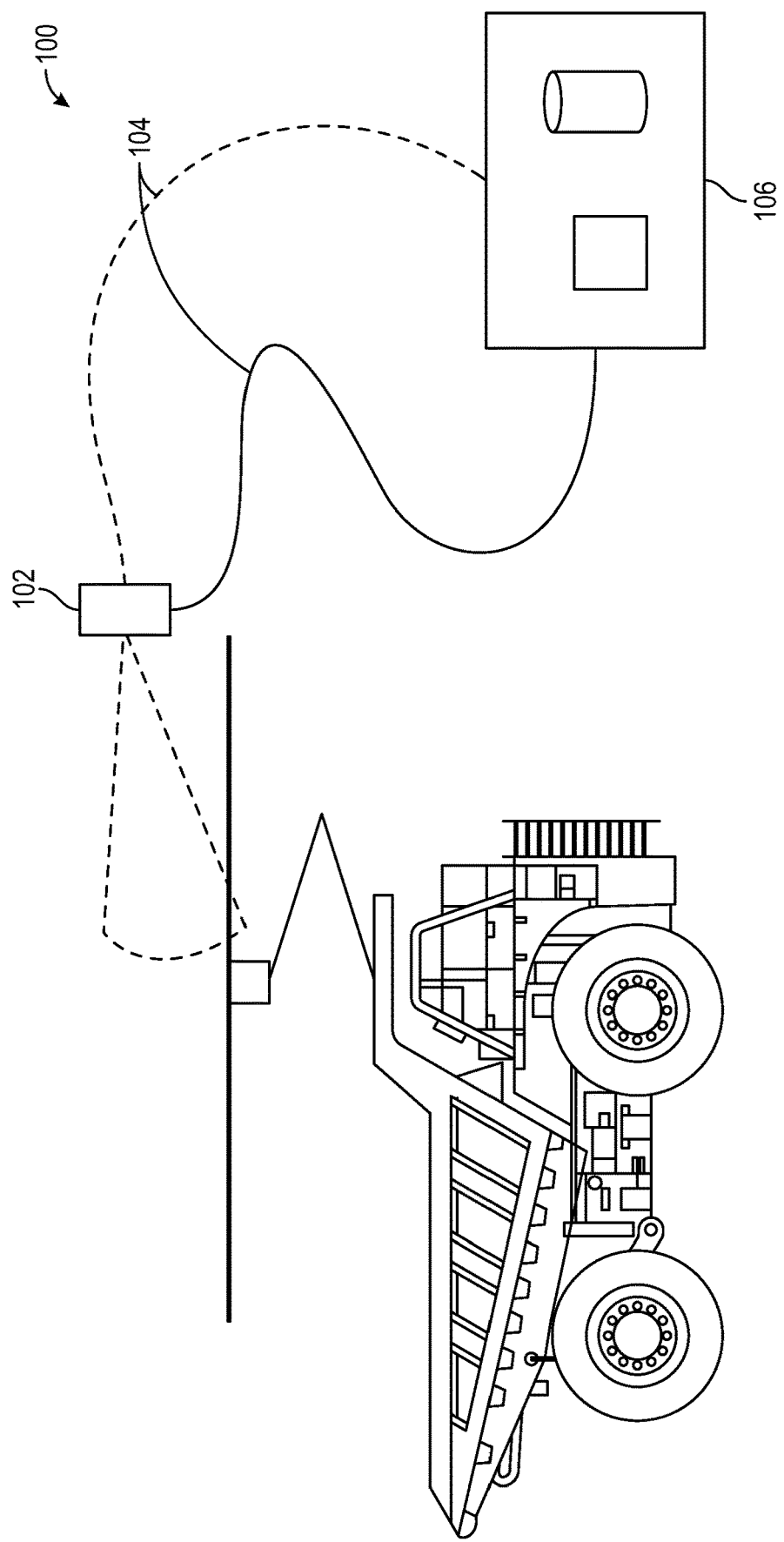
FIG. 5 is a schematic view of a wear monitoring system, according to one or more embodiments.

To this end, an electrical contact wear monitoring system 100 may be provided. The wear monitoring system 100 may be incorporated into a vehicle or work machine 50, the system may be partially on the vehicle or work machine 50 and partially off of the vehicle or work machine 50, or the system may be entirely off of the vehicle or work machine 50. In any case, and as shown schematically in FIG. 5, the system may include a wear sensor 102, a data transfer system 104, and a data processing module 106.

As mentioned, the wear sensor 102 may be provided on the vehicle or work machine 50 or off of the vehicle or work machine 50. The wear sensor 102 may be configured to sense the condition of the electrical contacts 62 and, in particular, may be configured to capture spatial data defining a surface profile of the electrical contacts 62. In one or more examples, the sensor 102 may include a light detection and ranging system (LIDAR). In other examples, a 3D scanner, a camera, a series of cameras, or another type of spatial sensor may be provided. As shown in FIG. 1, the wear sensor 102 may be arranged on a top of a vehicle or work machine 50 where it has a line of sight to the electrical contacts. In one or more examples, the wear sensor 102 may be arranged on a base frame of the pantograph 60 and may include an extension feature to allow it to be above the electrical contacts. In one or more examples, the wear sensor may be below the operational height of the electrical contacts so as to avoid contact with high voltage lines and sensing of the contacts may be reserved for when the contacts are lowered and not in use, for example. In one example, the wear sensor 102 may be arranged at the ends of the electrical contacts 62 and may face generally across the width of the vehicle or work machine and along the electrical contacts 62. Still other wear sensor positions may be provided. Additionally, or alternatively, and as also shown in FIG. 1, the wear sensor 102 may be arranged off of the vehicle or work machine 50 and, for example, may be arranged on the supports or towers 68 of the electrical power system. Particularly, the wear sensor 102 may be arranged on the upright column or pole 70 or the wear sensor 102 may be provided on the transverse beam 72, for example. The wear sensor 102 may be directed slightly downward to capture surface data about the electrical contact 62 as a vehicle or work machine 50 passes by the support or tower 70.

The wear sensor 102 may capture two-dimensional and/or three-dimensional data about the electrical contact 62. That is, in some cases two-dimensional data may be sufficient to assess wear. For example, a view from a front or back of the electrical contact 62 may reveal highs and lows in the surface of the contact 62 and/or missing sections of contact material 76. This may allow for identification of grooves, depressions, or missing segments of the electrical contact 62. In other cases, three-dimensional data may be used and may help to identify missing segments that may not extend fully through the electrical contact 62, where a front or rear view may not reveal the missing segment. Three-dimensional data may allow for generation of a fully profile of the electrical contact 62. Still other bases for using two-dimensional data or three-dimensional data may be provided.

With reference back to FIG. 5, the data transfer system 104 may be configured to transmit data from the wear sensor 102 to the data processing module 106. Depending on the location of the 62 wear sensor 102 and/or the location of the data processing module 106, one or more types of data transfer systems may be provided. For example, where the wear sensor 102 is on the machine 50 and the data processing module 106 is on the machine 50 such as part of the electronic control module or other computing device, the data transfer system 104 may include a wired or wireless data connection between the wear sensor 102 and the data processing module 106. The data transfer system 104 may also include a wireless data connection to one or more remote computers (e.g., off vehicle/machine) that may, for example, be configured for managing a fleet or otherwise remotely interacting with the vehicle or haul truck. The wireless communication systems used may depend, generally, on the distance the over which the data is being transferred. That is, suitable short-range systems may include Bluetooth, WiFi, Zigbee, or other relatively short-range systems. Longer range systems may include cellular networks, short-range systems in combination with long-range wired or wireless systems, and other types of communications systems.

In any case, the data processing module 106 may receive sensor data from the wear sensor 102 and may be configured for assessing the condition of one or more electrical contacts 62. In one or more examples, as mentioned above, the data processing module 106 may be part of an electronic control module of a vehicle or work machine 50 or a dedicated or other computing device may be provided for hosting the data processing module. The dedicated or other computing device may be on the vehicle/machine or off the vehicle/machine. The data processing module 106 may include software, hardware, or a combination of software and hardware that is configured for performing the assessment of the condition of the electrical contacts 62. The method of assessment is discussed in more detail below with respect to FIG. 6. In one or more examples, the method may include identifying defects. Moreover, and depending on the nature of the defects identified, the data processing module may also perform remedial tasks or take other actions to avoid further damage. These steps are also discussed in more detail below with respect FIG. 6.

INDUSTRIAL APPLICABILITY

Figure 6:
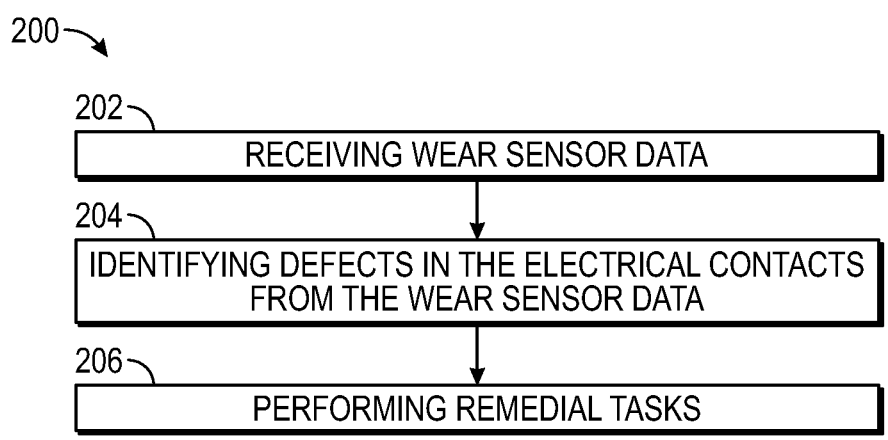
FIG. 6 is a diagram depicting a method of monitoring electrical contacts, according to one or more embodiments.
Figure 7:
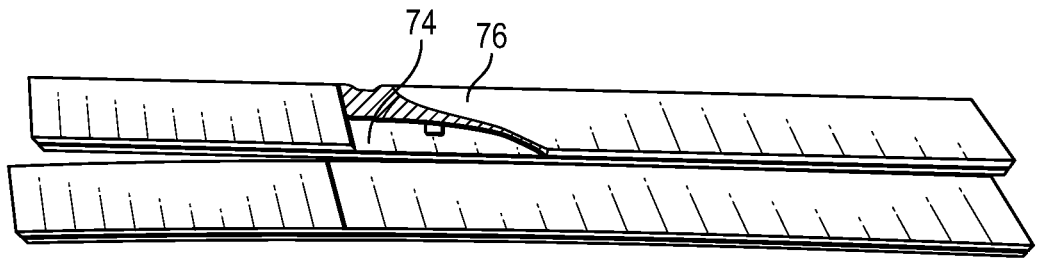
FIG. 7 is a top perspective view of damaged contacts.
Figure 8:
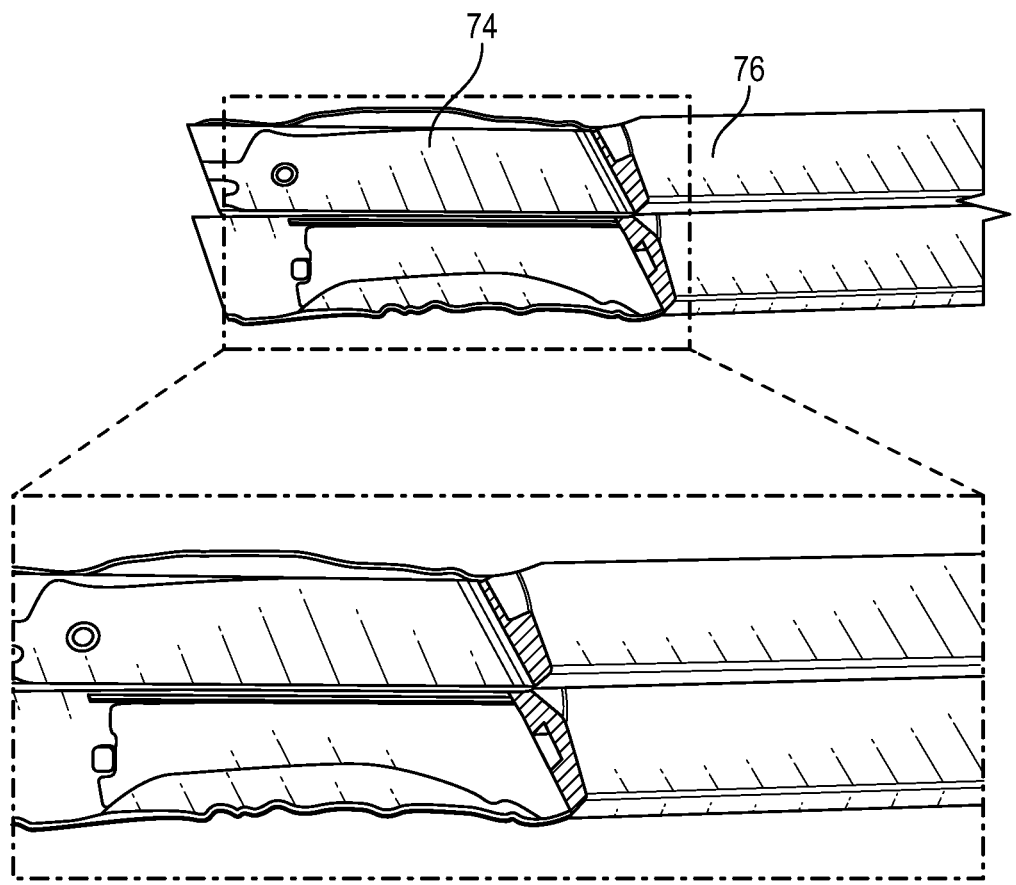
FIG. 8 is top perspective view of damaged contacts.

In operation and use, and as shown in FIG. 6, a method of assessing wear 200 of an electrical contact for an overhead trolley line may be provided. As shown, the method may include receiving wear sensor data 202. The method may also include identifying defects in the electrical contacts from the wear sensor data 204. In one or more examples, identifying defects may include analyzing the sensor data to define a surface elevation or a surface profile of the electrical contact and measuring deviations from the surface elevation or measure thicknesses along the length of the carbon plate or brush. Where the deviations from a surface elevation exceed a designated wear amount (e.g., >75%, 65%, 50%, or other percent of the original carbon plate or brush thickness), a defect may be identified. In the case of thicknesses, where a thickness of 50%, 35%, or 25%, for example, are found, a defect may be identified. The length of the defect along the electrical contact may be measured and the extent of the defect identified to see if remaining areas of the electrical contact remain suitable for continued use (e.g., areas having wear amounts less that the designated wear amount or thickness greater than a designated thickness). In one or more other examples, identifying defects may additionally, or alternatively, include analyzing the sensor data to identify cracks in the carbon plate or brush such as those shown in FIG. 7. In still other examples, identifying defects may include identifying missing portions or segments of the electrical contact such as those shown in FIGS. 7 and 8. This may be performed where deviations of the surface elevation are 100% of the original carbon plate or brush thickness or where a substantially flat and uniform surface is present at a bottom of a deviation suggesting that the frame or bar supporting the carbon plate or brush has been exposed. In one or more examples, image examples of good and bad electrical contacts may be used to train the software to identify good and bad images. As suggested above, the method may also include performing remedial tasks 206, which may include sending instructions or notifications to operators, suggesting that they change the alignment of the vehicle or machine when travelling on the haul road. For example, if wear is occurring in a particular location on electrical contacts and additional less worn areas of the electrical contact are available, the operator may, for example, change the lateral position of the vehicle or haul truck on the haul road to cause the other less worn areas of the electrical contact to engage the overhead trolley line. In other examples, where higher degrees of wear exist, where portions are cracked or broken, or where larger area of the electrical contacts are affected, the data processing module may send an alert to the operator indicating that repair is needed or, where potentially dangerous conditions exist, machine intervention may be performed. Still other remedial actions may be performed by the data processing system. For example, trolley line access control using traffic lights may be used to allow or disallow operators to access the trolley line if the electrical contacts on their vehicle are not suitable for electrically connecting to the trolley line. Additionally, reports may be sent to dispatch to schedule maintenance when contacts are unsuitable for use or otherwise deteriorating. In these situations, the machine may be able to run under the power of a combustion engine or other power source until repairs can be made.

The above detailed description is intended to be illustrative, and not restrictive. The scope of the disclosure should, therefore, be determined with references to the appended claims, along with the full scope of equivalents to which such claims are entitled.

What is claimed is:

1. A system for monitoring electrical contacts for a trolley line arranged along a haul road, comprising:
a wear sensor arranged such that an electrical contact on a work machine for contacting the trolley line is continually or periodically in its line of sight, the wear sensor configured to capture spatial data defining the surface profile of the electrical contact;
a data processing module configured to:
receive the spatial data;
identify a defect in the electrical contact based on the spatial data and determine an extent of the identified defect on the electrical contact;
identify a non-defective area of the electrical contact suitable for continued used based on the determined extent of the identified defect; and
perform a remedial task based on the identified defect and the identified non-defective area including notifying an operator to change a lateral position of the work machine on the haul road to align the non-defective area with the trolley line.

2. The system of claim 1, wherein identify a defect in the electrical contact comprises determining a deviation from an original surface of the electrical contact.

3. The system of claim 1, wherein identifying a defect in the electrical contact comprises determining a remaining thickness of the electrical contact.

4. The system of claim 1, further comprising determining an extent of the defect along a length of the electrical contact.

5. The system of claim 1, wherein performing a remedial task includes notifying an operator that repair is needed.

6. The system of claim 1, wherein the wear sensor is arranged on the work machine.

7. The system of claim 1, wherein the wear sensor is arranged on a support of the trolley line.

8. The system of claim 1, wherein the wear sensor is a light detection and ranging system.

9. The system of claim 1, wherein perform a remedial task further comprises disallowing the operator to access the trolley line if the electrical contact on the work machine is not suitable for electrically contacting the trolley line.

10. The system of claim 9, where disallowing comprises triggering a traffic light.

11. A method of assessing wear of an electrical contact for a trolley line along a haul road, the method comprising:
- receiving spatial data from a wear sensor defining the surface profile of an electrical contact on a vehicle or work machine;
- identifying a defect in the electrical contact based on the spatial data and determining an extent of the identified defect on the electrical contact;
- identifying a non-defective area of the electrical contact suitable for continued use based on the determined extent of the identified defect; and
- performing a remedial task based on the identified defect and the identified non-defective area including notifying an operator to change a lateral position of the work machine on the haul road to align the non-defective area with the trolley line.

12. The method of claim 11, wherein identifying a defect in the electrical contact comprises determining a deviation from an original surface of the electrical contact.

13. The method of claim 11, wherein identifying a defect in the electrical contact comprises determining a remaining thickness of the electrical contact.

14. The method of claim 11, further comprising determining an extent of the defect along a length of the electrical contact.

15. The method of claim 11, wherein performing a remedial task includes notifying an operator that repair is needed.

16. The method of claim 11, wherein performing a remedial task further comprises disallowing the operator to access the trolley line if the electrical contact on the work machine is not suitable for electrically contacting the trolley line.

17. The method of claim 16, wherein disallowing comprises triggering a traffic light.

* * * * *